US009564238B1

(12) United States Patent
Bai et al.

(10) Patent No.: US 9,564,238 B1
(45) Date of Patent: Feb. 7, 2017

(54) FLASH MEMORY SYSTEM USING MEMORY CELL AS SOURCE LINE PULL DOWN CIRCUIT

(71) Applicant: Silicon Storage Technology, Inc., San Jose, CA (US)

(72) Inventors: Ning Bai, Shanghai (CN); Hieu Van Tran, San Jose, CA (US); Qing Rao, Shanghai (CN); Parviz Ghazavi, San Jose, CA (US); Kai Man Yue, Shanghai (CN)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 14/919,005

(22) Filed: Oct. 21, 2015

(30) Foreign Application Priority Data

Sep. 11, 2015 (CN) .......................... 2015 1 0647190

(51) Int. Cl.
*G11C 16/28* (2006.01)
*G11C 16/14* (2006.01)

(52) U.S. Cl.
CPC ............... *G11C 16/28* (2013.01); *G11C 16/14* (2013.01)

(58) Field of Classification Search
CPC .................................. G11C 16/28; G11C 16/14
See application file for complete search history.

(56) References Cited

U.S. PATENT DOCUMENTS

| 2006/0139997 | A1* | 6/2006 | Park | G11C 16/0483 365/185.2 |
| 2009/0180317 | A1* | 7/2009 | Kang | G11C 11/5628 365/185.2 |
| 2011/0085385 | A1* | 4/2011 | Park | G11C 11/5621 365/185.22 |
| 2014/0063985 | A1* | 3/2014 | Joo | G11C 16/0483 365/189.011 |

\* cited by examiner

*Primary Examiner* — Khamdan Alrobaie
(74) *Attorney, Agent, or Firm* — DLA Piper LLP (US)

(57) ABSTRACT

The present invention relates to a flash memory device that uses dummy memory cells as source line pull down circuits. In one embodiment, when a memory cell is in read mode or erase mode, its source line is coupled to ground through a bitline of a dummy memory cell, which in turn is coupled to ground. When the memory cell is in program mode, the bitline of the dummy memory cell is coupled to an inhibit voltage, which places the dummy memory cell in a program inhibit mode that maintains the dummy memory cell in erased state.

14 Claims, 5 Drawing Sheets

FLASH MEMORY SYSTEM USING MEMORY CELL AS SOURCE LINE PULL DOWN CIRCUIT

PRIORITY CLAIM

The present application claims priority under 35 U.S.C. Section 119 to Patent Application 201510647190.0, titled "Flash Memory System Using Memory Cell As Source Line Pull Down Circuit" and filed in the People's Republic of China on Sep. 11, 2015, which is incorporated by reference herein.

TECHNICAL FIELD

The present invention relates to a flash memory device that uses dummy memory cells as source line pull down circuits.

BACKGROUND OF THE INVENTION

Non-volatile memory cells are well known in the art. A first type of prior art non-volatile memory cell 110 is shown in FIG. 1. The memory cell 110 comprises a semiconductor substrate 112 of a first conductivity type, such as P type. The substrate 112 has a surface on which there is formed a first region 114 (also known as the source line SL) of a second conductivity type, such as N type. A second region 116 (also known as the drain line) also of N type is formed on the surface of the substrate 112. Between the first region 114 and the second region 116 is a channel region 118. A bit line BL 120 is connected to the second region 116. A word line WL 122 is positioned above a first portion of the channel region 118 and is insulated therefrom. The word line 122 has little or no overlap with the second region 116. A floating gate FG 124 is over another portion of the channel region 118. The floating gate 124 is insulated therefrom, and is adjacent to the word line 122. The floating gate 124 is also adjacent to the first region 114. The floating gate 124 may overlap the first region 114 significantly to provide strong coupling from the region 114 into the floating gate 124.

One exemplary operation for erase and program of prior art non-volatile memory cell 110 is as follows. The cell 110 is erased, through a Fowler-Nordheim tunneling mechanism, by applying a high voltage on the word line 122 and zero volts to the bit line and source line. Electrons tunnel from the floating gate 124 into the word line 122 causing the floating gate 124 to be positively charged, turning on the cell 110 in a read condition. The resulting cell erased state is known as '1' state. The cell 110 is programmed, through a source side hot electron programming mechanism, by applying a high voltage on the source line 114, a small voltage on the word line 122, and a programming current on the bit line 120. A portion of electrons flowing across the gap between the word line 122 and the floating gate 124 acquire enough energy to inject into the floating gate 124 causing the floating gate 124 to be negatively charged, turning off the cell 110 in read condition. The resulting cell programmed state is known as '0' state.

Exemplary voltages that can be used for the read, program, erase, and standby operations in memory cell 110 is shown below in Table 1:

TABLE 1

| Operation | WL | WL-unsel | BL | BL-unsel | SL | SL-unsel |
|---|---|---|---|---|---|---|
| Read | Vwlrd | 0 V | Vblrd | 0 V | 0 V | 0 V |
| Program | Vwlp | 0 V | Iprog | Vinh | Vslp | 0-1 V-FLT |
| Erase | Vwler | 0 V | 0 V | 0 V | 0 V | 0 V |
| Standby | 0 V | 0 V | 0 V | 0 V | 0 V | 0 V |

Vwlrd ~2-3 V
Vblrd ~0.8-2 V
Vwlp ~1-2 V
Vwler ~11-13 V
Vslp ~9-10V
FLT = float
Iprog ~1-3 ua
Vinh ~2 V A second type of prior art non-volatile memory cell 210 is shown in FIG. 2. The memory cell 210 comprises a semiconductor substrate 212 of a first conductivity type, such as P type. The substrate 212 has a surface on which there is formed a first region 214 (also known as the source line SL) of a second conductivity type, such as N type. A second region 216 (also known as the drain line) also of N type is formed on the surface of the substrate 212. Between the first region 214 and the second region 216 is a channel region 218. A bit line BL 220 is connected to the second region 216. A word line WL 222 is positioned above a first portion of the channel region 218 and is insulated therefrom. The word line 222 has little or no overlap with the second region 216. A floating gate FG 224 is over another portion of the channel region 218. The floating gate 224 is insulated therefrom, and is adjacent to the word line 222. The floating gate 224 is also adjacent to the first region 214. The floating gate 224 may overlap the first region 214 to provide coupling from the region 214 into the floating gate 224. A coupling gate CG (also known as control gate) 226 is over the floating gate 224 and is insulated therefrom.

One exemplary operation for erase and program of prior art non-volatile memory cell 210 is as follows. The cell 210 is erased, through a Fowler-Nordheim tunneling mechanism, by applying a high voltage on the word line 222 with other terminals equal to zero volt. Electrons tunnel from the floating gate 224 into the word line 222 to be positively charged, turning on the cell 210 in a read condition. The resulting cell erased state is known as '1' state. The cell 210 is programmed, through a source side hot electron programming mechanism, by applying a high voltage on the coupling gate 226, a high voltage on the source line 214, and a programming current on the bit line 220. A portion of electrons flowing across the gap between the word line 222 and the floating gate 224 acquire enough energy to inject into the floating gate 224 causing the floating gate 224 to be negatively charged, turning off the cell 210 in read condition. The resulting cell programmed state is known as '0' state.

Exemplary voltages that can be used for the read, program, erase, and standby operations in memory cell 210 is shown below in Table 2:

TABLE 2

| Operation | WL | WL-unselect | BL | BL-unselect | CG | CG-unselect same sector | CG-unselect | SL | SL-unselect |
|---|---|---|---|---|---|---|---|---|---|
| Read | 1.0-3 V | 0 V | 0.6-2 V | 0 V | 0-2.6 V | 0-2.6 V | 0-2.6 V | 0 V | 0 V |
| Erase | 11-10 V | 0 V | 0 V | 0 V | 0 V | 0 V | 0 V | 0 V | 0 V |
| Program | 1 V | 0 V | 1uA | Vinh | 8-11 V | 0-2.6 V | 0-2.6 V | 4.5-5 V | 0-1 V-FLT |

Another set of exemplary voltages (when a negative voltage is available for read and program operations) that can be used for the read, program, and erase operations in memory cell 210 is shown below in Table 3:

TABLE 3

| Operation | WL | WL-unselect | BL | BL-unselect | CG | CG-unselect same sector | CG-unselect | SL | SL-unselect |
|---|---|---|---|---|---|---|---|---|---|
| Read | 1.0-2 V | −0.5V/0 V | 0.6-2 V | 0 V | 0-2.6 V | 0-2.6 V | 0-2.6 V | 0 V | 0 V |
| Erase | 11-10 V | 0 V | 0 V | 0 V | 0 V | 0 V | 0 V | 0 V | 0 V |
| Program | 1 V | −0.5 V/0 V | 1uA | Vinh | 8-11 V | 0-2.6 V | 0-2.6 V | 4.5-5 V | 0-1 V-FLT |

Another set of exemplary voltages (when a negative voltage is available for read, program, and erase operations) that can be used for the read, program, and erase operations in memory cell 210 is shown below in Table 4:

TABLE 4

| Operation | WL | WL-unselect | BL | BL-unselect | CG | CG-unselect same sector | CG-unselect | SL | SL-unselect |
|---|---|---|---|---|---|---|---|---|---|
| Read | 1.0-2 V | −0.5 V/0 V | 0.6-2 V | 0 V | 0-2.6 V | 0-2.6 V | 0-2.6 V | 0 V | 0 V |
| Erase | 9-6 V | −0.5 V/0 V | 0 V | 0 V | −(5-9) V | 0 V | 0 V | 0 V | 0 V |
| Program | 1 V | −0.5 V/0 V | 1uA | Vinh | 8-9 V | 0-2.6 V | 0-2.6 V | 4.5-5 V | 0-1 V-FLT |

A third type of non-volatile memory cell 310 is shown in FIG. 3. The memory cell 310 comprises a semiconductor substrate 312 of a first conductivity type, such as P type. The substrate 312 has a surface on which there is formed a first region 314 (also known as the source line SL) of a second conductivity type, such as N type. A second region 316 (also known as the drain line) also of N type is formed on the surface of the substrate 312. Between the first region 314 and the second region 316 is a channel region 318. A bit line BL 320 is connected to the second region 316. A word line WL 322 is positioned above a first portion of the channel region 318 and is insulated therefrom. The word line 322 has little or no overlap with the second region 316. A floating gate FG 324 is over another portion of the channel region 318. The floating gate 324 is insulated therefrom, and is adjacent to the word line 322. The floating gate 324 is also adjacent to the first region 314. The floating gate 324 may overlap the first region 314 to provide coupling from the region 314 into the floating gate 324. A coupling gate CG (also known as control gate) 326 is over the floating gate 324 and is insulated therefrom. An erase gate EG 328 is over the first region 314 and is adjacent to the floating gate 324 and the coupling gate 326 and is insulated therefrom. The top corner of the floating gate 324 may point toward the inside corner of the T-shaped erase gate 328 to enhance erase efficiency. The erase gate 328 is also insulated from the first region 314. The cell 310 is more particularly described in U.S. Pat. No. 7,868,375 whose disclosure is incorporated herein by reference in its entirety.

One exemplary operation for erase and program of prior art non-volatile memory cell 310 is as follows. The cell 310 is erased, through a Fowler-Nordheim tunneling mechanism, by applying a high voltage on the erase gate 328 with other terminals equal to zero volt. Electrons tunnel from the floating gate 324 into the erase gate 328 causing the floating gate 324 to be positively charged, turning on the cell 310 in a read condition. The resulting cell erased state is known as '1' state. The cell 310 is programmed, through a source side hot electron programming mechanism, by applying a high voltage on the coupling gate 326, a high voltage on the source line 314, a medium voltage on the erase gate 328, and a programming current on the bit line 320. A portion of electrons flowing across the gap between the word line 322 and the floating gate 324 acquire enough energy to inject into the floating gate 324 causing the floating gate 324 to be negatively charged, turning off the cell 310 in read condition. The resulting cell programmed state is known as '0' state.

Exemplary voltages that can be used for the read, program, and erase operations in memory cell 310 is shown below in Table 5:

TABLE 5

| Operation | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2 V | 0 V | 0.6-2 V | 0 V | 0-2.6 V | 0-2.6 V | 0-2.6 V | 0-2.6 V | 0-2.6 V | 0 V | 0 V |
| Erase | 0 V | 0 V | 0 V | 0 V | 0 V | 0 V | 0 V | 11.5-12 V | 0-2.6 V | 0 V | 0 V |
| Program | 1 V | 0 V | 1uA | Vinh | 10-11 V | 0-5 V | 0-2.6 V | 4.5-8 V | 0-2.6 V | 4.5-5 V | 0-1 V-FLT |

For programming operation, the EG voltage can be applied much higher, e.g. 8V, than the SL voltage, e.g., 5V, to enhance the programming operation. In this case, the unselected CG program voltage is applied at a higher voltage (CG inhibit voltage), e.g. 6V, to reduce unwanted erase effect of the adjacent memory cells sharing the same EG gate of the selected memory cells.

Another set of exemplary voltages (when a negative voltage is available for read and program operations) that can be used for the read, program, and erase operations in memory cell 310 is shown below in Table 6:

TABLE 6

| Operation | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2 V | −0.5V/0 V | 0.6-2 V | 0 V | 0-2.6 V | 0-2.6 V | 0-2.6 V | 0-2.6 V | 0-2.6 V | 0 V | 0 V |
| Erase | 0 V | 0 V | 0 V | 0 V | 0 V | 0 V | 0 V | 11.5-12 V | 0-2.6 V | 0 V | 0 V |
| Program | 1 V | −0.5V/0 V | 1uA | Vinh | 10-11 V | 0-2.6 V | 0-2.6 V | 4.5-5 V | 0-2.6 V | 4.5-5 V | 0-1 V-FLT |

Another set of exemplary voltages (when a negative voltage is available for read, program, and erase operations) that can be used for the read, program, and erase operations in memory cell 310 is shown below in Table 7:

TABLE 7

| Operation | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2 V | −0.5 V/0 V | 0.6-2 V | 0 V | 0-2.6 V | 0-2.6 V | 0-2.6 V | 0-2.6 V | 0-2.6 V | 0 V | 0 V |
| Erase | 0 V | −0.5 V/0 V | 0 V | 0 V | −(5-9) V | 0 V | 0 V | 9-8 V | 0-2.6 V | 0 V | 0 V |
| Program | 1V | −0.5 V/0 V | 1uA | Vinh | 8-9 V | 0-5V | 0-2.6 V | 8-9V | 0-2.6 V | 4.5-5 V | 0-1 V-FLT |

For programming operation, the EG voltage is applied much higher, e.g. 8-9V, than the SL voltage, e.g., 5V, to enhance the programming operation. In this case, the unselected CG program voltage is applied at a higher voltage (CG inhibit voltage), e.g. 5V, to reduce unwanted erase effects of the adjacent memory cells sharing the same EG gate of the selected memory cells.

Memory cells of the types shown in FIGS. 1-3 typically are arranged into rows and columns to form an array. Erase operations are performed on entire rows or pairs of rows at one time, since word lines control entire rows of memory cells and erase gates (of the type shown in FIG. 3), when present, are shared by pairs of rows of memory cells.

For each of the prior art memory cells of FIGS. 1-3, and as can be seen in the above Tables, it often is necessary to pull the source line down to ground. FIG. 4 depicts a typical prior art technique for doing this. Memory system 400 comprises memory cell 410, word line 422, control gate 426, erase gate 428, bit line 420, and source line 414. Memory cell 410 can be any of the types shown in FIGS. 1-3, namely, memory cell 110, memory cell 210, memory cell 310, or another type of memory cell. Source line 414 is coupled to pull down transistor 430, which here comprises a single NMOS transistor. When the gate of pull down transistor 430 is activated, the source line is pulled down to ground. In a flash memory system, numerous pull down circuits of will be required, and each source line may require more than one pull down circuit. These pull down transistors require operating voltages of around 0-1.2 V for low voltage operations and 4-5-11.5 V for high voltage operations. This means that high voltage transistor type (e.g., 11.5v transistor) or IO transistor type (e.g., 2.5V or 3 v transistor) is required for the pull down transistors, which takes up die space and increases the overall cost and complexity of the system. In addition, the pull down transistors can incur over stress and break down during program mode.

What is needed is a new technique for pulling source lines to ground in a flash memory system that can use the same operating voltage range as the memory cells themselves and that are more robust to over stress and break down.

SUMMARY OF THE INVENTION

In the embodiments described below, flash memory devices utilize dummy memory cells as source line pull down circuits.

DETAILED DESCRIPTION OF THE PREFERRED EMBODIMENTS

Figure 1:
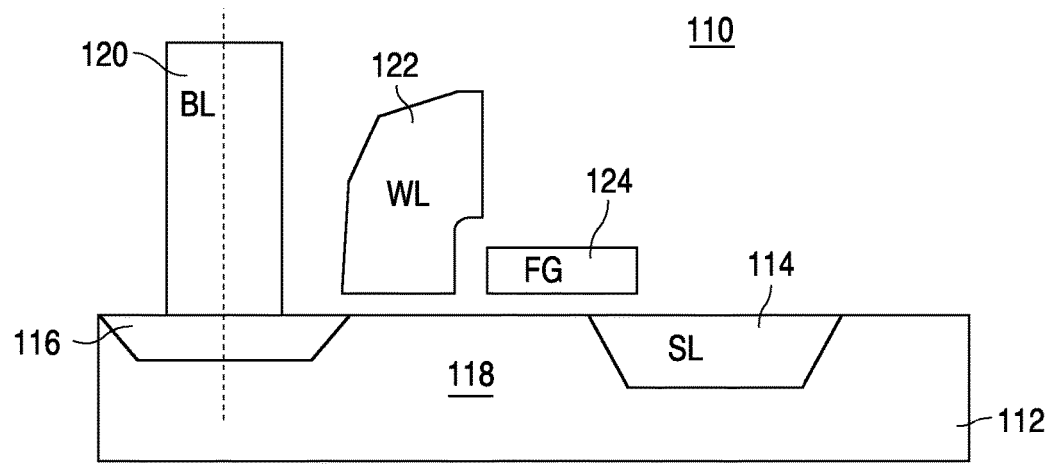
FIG. 1 is a cross-sectional view of a non-volatile memory cell of the prior art to which the method of the present invention can be applied.
Figure 2:
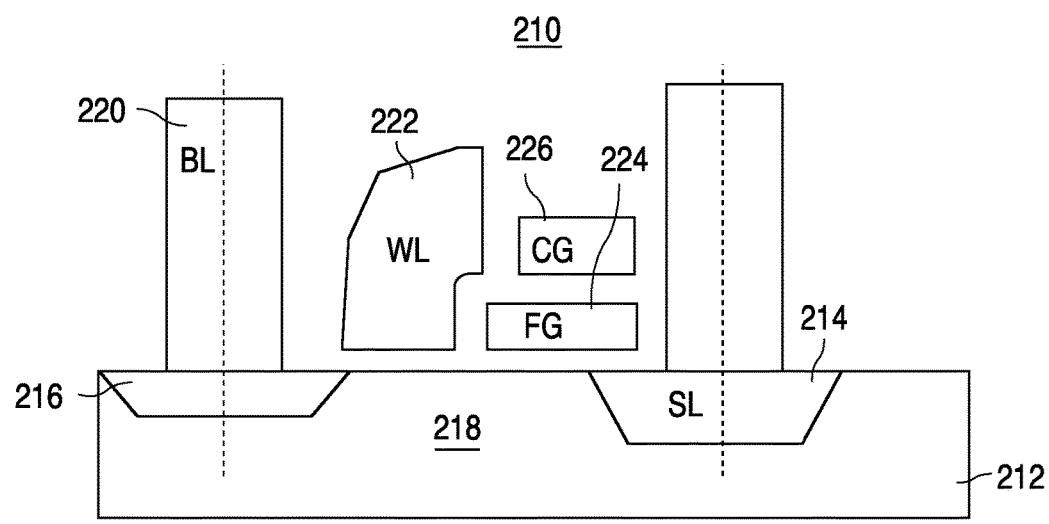
FIG. 2 is a cross-sectional view of a non-volatile memory cell of the prior art to which the method of the present invention can be applied.
Figure 3:
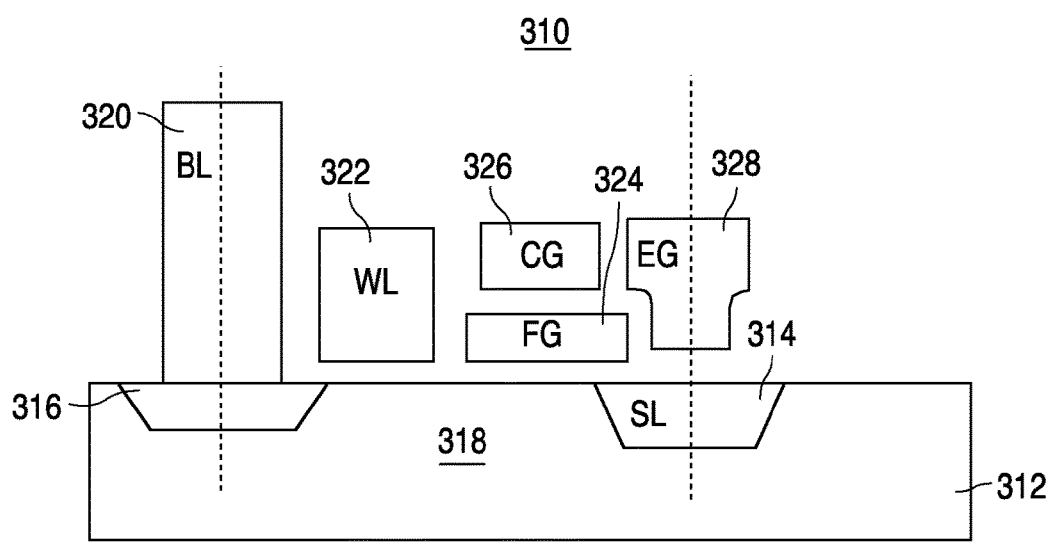
FIG. 3 is a cross-sectional view of a non-volatile memory cell of the prior art to which the method of the present invention can be applied.
Figure 4:
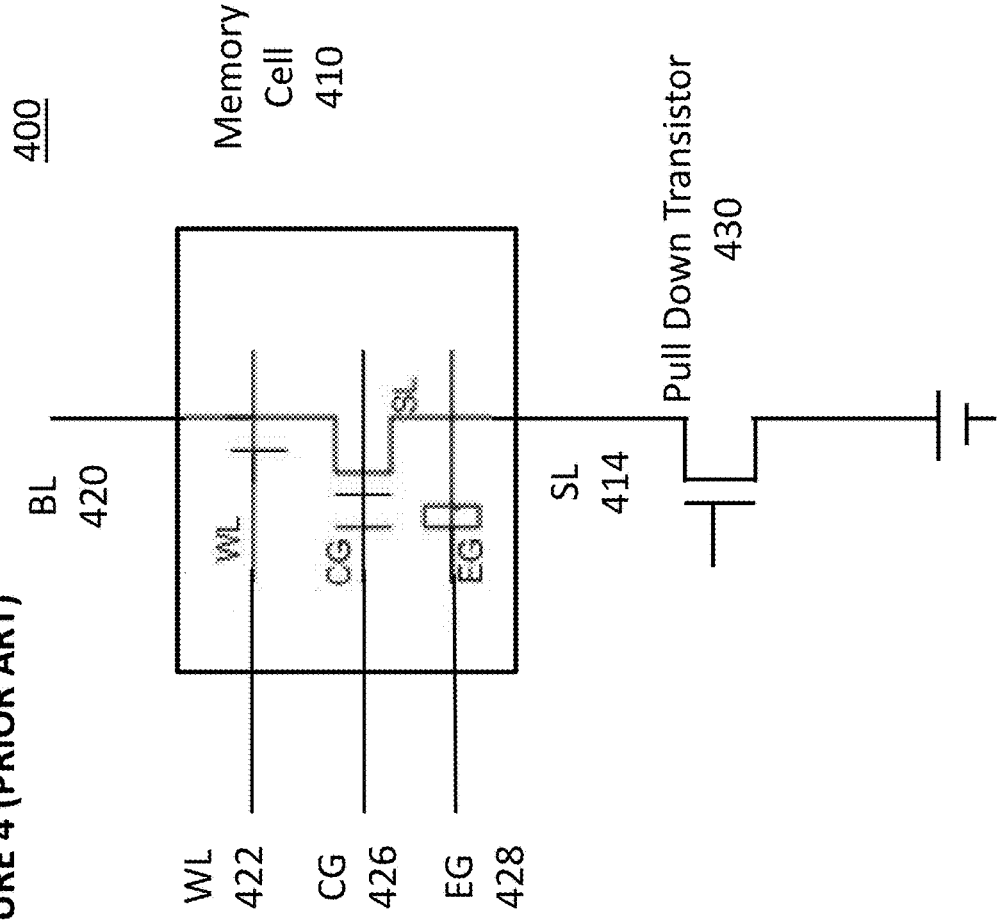
FIG. 4 depicts a prior art memory cell with a pull down transistor coupled to the source line.
Figure 5:
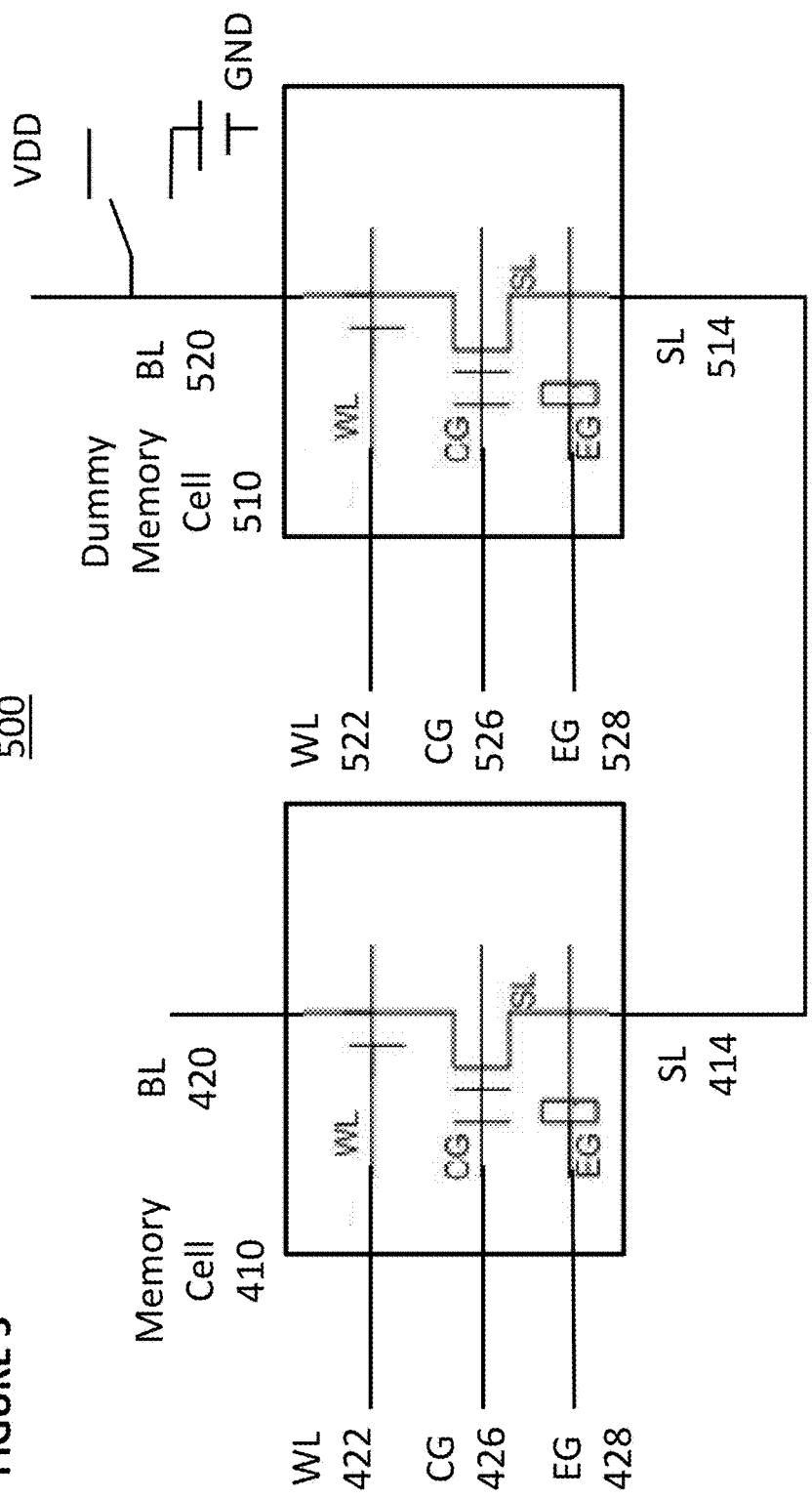
FIG. 5 depicts an embodiment where a dummy memory cell is used as a pull down circuit for a source line.

An embodiment is shown in FIG. 5. Flash memory system 500 comprises exemplary memory cell 410 and exemplary dummy memory cell 510. Dummy memory cell 510 is of the same construction as memory cell 410 except that dummy memory cell 510 is not used to store data. Source line 414 of memory cell 410 is coupled to source line 514 of dummy memory cell 510. In the example shown, memory cell 410 and dummy memory cell 510 follow the design of memory cell 310 in FIG. 3. It will be understood that memory cell 410 and dummy memory cell 510 also can follow the design of memory cell 210 in FIG. 2 (in which case erase gates 428 and 528 will not be present) or memory cell 110 in FIG. 1 (in which case erase gates 428 and 529 and control gate 426 and 526 will not be present).

When memory cell 410 is in read mode or erase mode, source line 514 is coupled to ground through the memory cell 510 to dummy bitline 520 which is coupled to ground. The dummy memory cells 150 are required to be erased before read operation. This will pull source line 414 and source line 514 to ground.

When the memory cell 410 is in program mode, the bitline line 520 is coupled to an inhibit voltage such as VDD. This will place the dummy memory cell 510 in a program inhibit mode which maintain the dummy memory cells in erased state. There is a plurality of the dummy cells 520 to strengthen the pull down of the source line 414 to ground.

Figure 6:
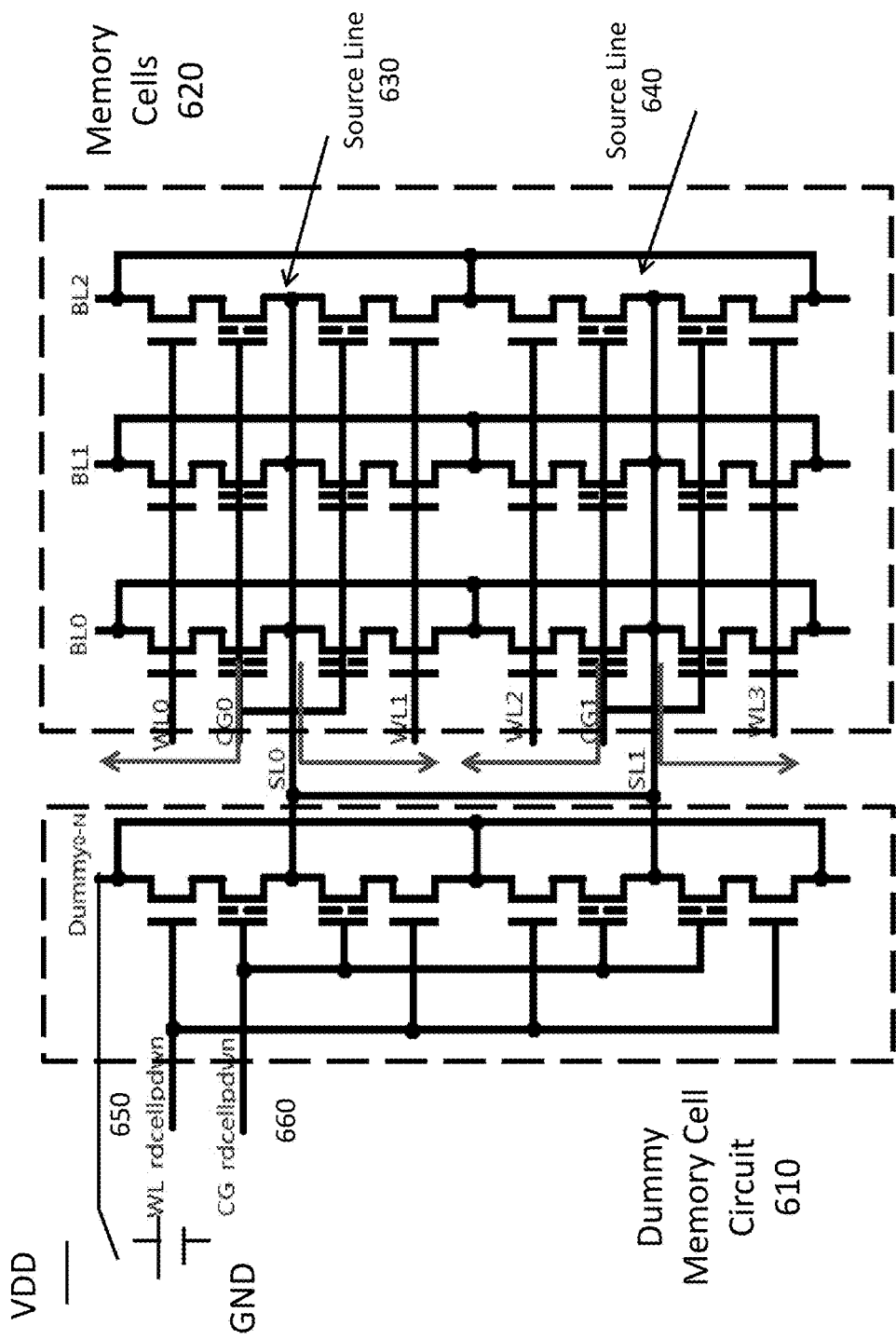
FIG. 6 depicts an embodiment where a plurality of dummy memory cells are used as a pull down circuit for a source line.

Another embodiment is shown in FIG. 6. Flash memory system 600 comprises exemplary memory cells 620 and exemplary dummy memory cell circuit 610. Dummy memory cell 610 comprises a plurality of dummy memory cells coupled to one another. In this example, source line 630 (also labeled SL0) and source line 640 (also labeled SL1) from memory cells 620 are coupled to source line of dummy memory cell circuit 610. In this embodiment source line 630 SL0 and source line 640 SL1 are connected together.

Thus, the source lines for an entire sector or sectors of memory cells can be coupled together to a source line of dummy memory cell circuit comprising dummy memory cells from the same rows of cells that are part of the sector or sectors.

When memory cell 620 are in read mode or erase mode, dummy memory cell circuit 620 will be coupled to ground through the dummy bitlines. The dummy memory cells are required to be erased before read operation. This will pull source lines 630 and 640 to ground.

When memory cell 620 are in program mode, the dummy bitlines of memory cell circuit 620 will be coupled to an inhibit voltage such as VDD. This will place dummy memory cells in a program inhibit mode which maintain the dummy memory cells in erased state.

Optionally, word line 650 (also labeled WL_rdcellpdwn, which is separate from wordlines of the memory cell 620) and control gate 660 (also labeled CG_rdcellpdwn, which is separate from control gates for the memory cell 620) are biased at a different voltage than that of the memory cell 620 such as VDD or higher during read or standby modes to minimize the current drop across the dummy memory cells.

The embodiments of FIGS. 5 and 6 have numerous benefits over the prior art. First, the source line pull down current is distributed among many dummy memory cells and metal paths, which results in lower electromagnetic interference and less decoding interconnection. Second, there is less current drop across the dummy memory cells compared to the pull down high voltage transistors of the prior art. Third, the embodiments require less die space versus the high voltage transistor pull down solution. Fourth, bias and logic control of the embodiments are simpler than that of the pull down transistors of the prior art. This results in less overstress and break down during programming modes.

What is claimed is:

1. A flash memory system comprising:
a flash memory cell comprising a first source line;
a dummy flash memory cell comprising a second source line and a bit line, the second source line coupled to the first source line, wherein the second source line is coupled to ground through the bit line when the flash memory cell is in a read mode or an erase mode and the bit line is coupled to a voltage source when the memory cell is in a program mode.

2. The system of claim 1, wherein the flash memory cell comprises a first control gate and the dummy flash memory cell comprises a second control gate.

3. The system of claim 2, wherein the flash memory cell comprises a first erase gate and the dummy flash memory cell comprises a second erase gate.

4. The system of claim 1, wherein the dummy memory cell is in an erased state when the memory cell is in the read mode.

5. A flash memory system comprising:
a first plurality of flash memory cells coupled to a common source line;
a plurality of dummy flash memory cells coupled to the common source line and to a dummy bit line, and the common source line is coupled to ground through the dummy bit line when the first plurality of flash memory cells are in a read mode or an erase mode and the dummy bit line is coupled to a voltage source when the first plurality of flash memory cells is in a program mode.

6. The system of claim 5, wherein each of the first plurality of flash memory cells comprises a control gate and each of the plurality of dummy flash memory cells comprises a control gate.

7. The system of claim 6, wherein the control gate of each of the plurality of dummy memory cells is biased at a different voltage than the control gate of each of the first plurality of the flash memory cells.

8. The system of claim 6, wherein each of the first plurality of flash memory cells comprises an erase gate and each of the plurality of dummy flash memory cells comprises an erase gate.

9. The system of claim 5, wherein each of the first plurality of flash memory cells further comprises a word line and each of the plurality of dummy flash memory cells comprises a dummy word line.

10. The system of claim 9, wherein the dummy word line of each of the plurality of dummy memory cells is biased at a different voltage than the word line of each of the first plurality of memory cells.

11. The system of claim 5, wherein the first plurality of flash memory cells comprises a sector of flash memory cells that can be erased as a unit.

12. The system of claim 5, wherein the first plurality of flash memory cells comprises a sector of flash memory cells that can be erased as a unit.

13. The system of claim 12, wherein the second plurality of flash memory cells comprises a sector of flash memory cells that can be erased as a unit.

14. The system of claim 5, wherein the first plurality of flash memory cells and the second plurality of flash memory cells comprise a sector of flash memory cells that can be erased as a unit.

* * * * *